US011139309B2

United States Patent
Muthukrishnan et al.

(10) Patent No.: US 11,139,309 B2
(45) Date of Patent: Oct. 5, 2021

(54) INTEGRATED CIRCUITRY, ARRAYS OF CAPACITORS OF INTEGRATED CIRCUITRY, AND METHODS USED IN THE FABRICATION OF INTEGRATED CIRCUITRY

(71) Applicant: Micron Technology, Inc., Boise, ID (US)

(72) Inventors: Kamal Kumar Muthukrishnan, Boise, ID (US); Alex J. Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 56 days.

(21) Appl. No.: 16/503,178

(22) Filed: Jul. 3, 2019

(65) Prior Publication Data

US 2021/0005619 A1  Jan. 7, 2021

(51) Int. Cl.
*H01L 27/11502* (2017.01)
*G11C 11/22* (2006.01)
*H01L 27/108* (2006.01)
*H01L 29/51* (2006.01)

(52) U.S. Cl.
CPC ...... *H01L 27/11502* (2013.01); *G11C 11/221* (2013.01); *H01L 27/1085* (2013.01); *H01L 27/10805* (2013.01); *H01L 29/516* (2013.01)

(58) Field of Classification Search
CPC ........... H01L 27/11502; H01L 27/1085; H01L 27/10805; H01L 29/516; H01L 27/11507; H01L 27/10852; H01L 28/90; H01L 27/11504; G11C 11/221
See application file for complete search history.

(56) References Cited

U.S. PATENT DOCUMENTS

| 6,297,527 | B1 * | 10/2001 | Agarwal | H01G 4/008 257/296 |
| 2003/0001180 | A1 * | 1/2003 | Narimatsu | H01L 27/10855 257/296 |
| 2003/0089925 | A1 * | 5/2003 | Tsunomura | H01L 27/10852 257/203 |
| 2018/0158826 | A1 * | 6/2018 | Cho | H01L 27/10876 |

* cited by examiner

*Primary Examiner* — Cuong B Nguyen
(74) *Attorney, Agent, or Firm* — Wells St. John P.S.

(57) ABSTRACT

Integrated circuitry comprises a plurality of features horizontally arrayed in a two-dimensional (2D) lattice. The 2D lattice comprises a parallelogram unit cell having four lattice points and four straight-line sides between pairs of the four lattice points. The parallelogram unit cell has a straight-line diagonal there-across between two diagonally-opposed of the four lattice points. The straight-line diagonal is longer than each of the four straight-line sides. Individual of the features are at one of the four lattice points and occupy a maximum horizontal area that is horizontally elongated along a direction that is horizontally angled relative to each of the four straight-line sides. Other embodiments, including methods, are disclosed.

33 Claims, 22 Drawing Sheets

INTEGRATED CIRCUITRY, ARRAYS OF CAPACITORS OF INTEGRATED CIRCUITRY, AND METHODS USED IN THE FABRICATION OF INTEGRATED CIRCUITRY

TECHNICAL FIELD

Embodiments disclosed herein pertain to integrated circuitry, to arrays of capacitors of integrated circuitry, and to methods used in the fabrication of integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array and the wordlines may conductively interconnect memory cells along rows of the array. Each memory cell may be uniquely addressed through the combination of a digitline and a wordline.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

A capacitor is another type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile. Regardless, a typical goal in the fabrication of capacitors is to maximize surface area of the capacitor electrodes towards maximizing capacitance of the individual capacitors.

Capacitors and transistors may of course be used in integrated circuitry other than memory circuitry.

DETAILED DESCRIPTION OF EXAMPLE EMBODIMENTS

Embodiments of the invention encompass methods used in the fabrication of integrated circuitry and integrated circuitry independent of method of manufacture. Integrated circuitry manufactured in accordance with method embodiments may have any of the attributes as described herein in structure embodiments. Example integrated circuitry in accordance with an embodiment of the invention is shown and initially described with reference to FIGS. 1-6. Such show part of a construction 10 comprising an array 12 of capacitors 14. Construction 10 comprises a base substrate 13 having any one or more of conductive/conductor/conducting, semiconductive/semiconductor/semiconducting, or insulative/insulator/insulating (i.e., electrically herein) materials. Various materials have been formed elevationally over base substrate 13. Materials may be aside, elevationally inward, or elevationally outward of the FIGS. 1 and 2—depicted materials. For example, other partially or wholly fabricated components of integrated circuitry may be provided somewhere above, about, or within base substrate 13. Control and/or other peripheral circuitry for operating components within an array (e.g., a memory array) may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Figure 2:
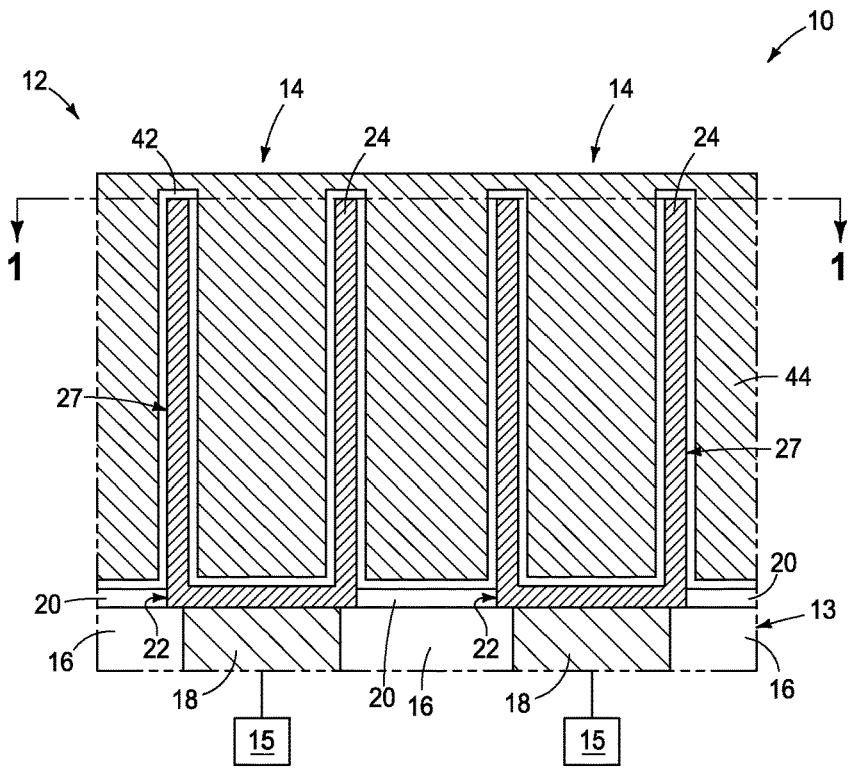
FIG. 2 is a diagrammatic cross-sectional view taken through line 2-2 in FIG. 1.

Access devices 15 are schematically shown in FIG. 2, and may be formed as part of base substrate 13. By way of example only, such may comprise field effect transistors for controlling access to individual capacitors 14, for example in DRAM circuitry where an access device 15 and a capacitor 14 comprise components of a single memory cell (e.g., a one transistor, one capacitor [1T/1C] memory cell). However, other memory and non-memory circuitry are contemplated and whether existing or yet-to-be-developed. Example base substrate 13 is shown as comprising insulative material 16 (e.g., doped and/or undoped silicon dioxide) having conductive vias 18 extending there-through for electrically coupling an individual access device 15 to an individual capacitor 14. An insulative material 20 (e.g., silicon nitride and/or silicon oxynitride) is shown atop base substrate 13, and includes openings 22 there-through that overlap with an individual conductive via 18. Material 20 may have functioned as an etch-stop during fabrication.

Figure 1:
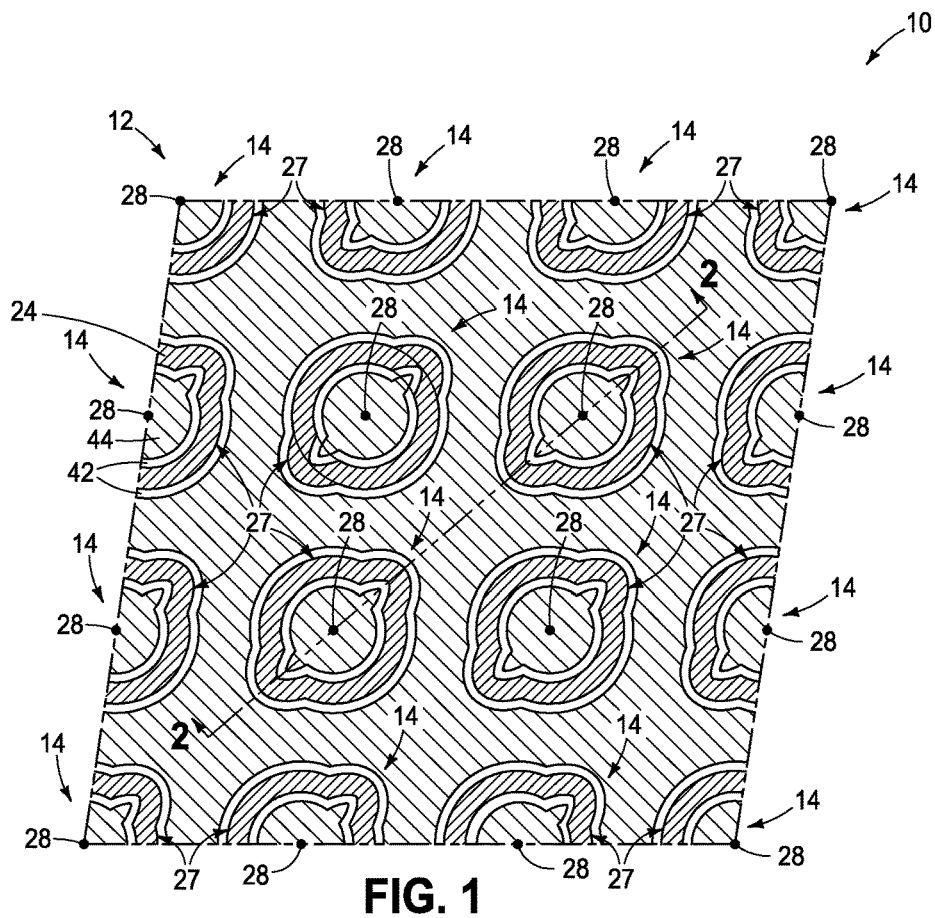
FIG. 1 is a diagrammatic cross-sectional view of a portion of an array of capacitors in accordance with an embodiment of the invention and is taken through line 1-1 in FIG. 2.

Capacitors 14 individually comprise a lower capacitor electrode 24, a capacitor insulator 42 there-atop, and at least one upper capacitor electrode 44 atop capacitor insulator 42. FIGS. 1 and 2 show an example embodiment wherein a singular upper capacitor electrode 44 is common to multiple capacitors 14 within array 12. Lower capacitor electrodes 24 and upper capacitor electrode(s) 44 may comprise the same composition or different compositions of conductive material. Example capacitor insulator materials include one or more of silicon dioxide, silicon nitride, aluminum dioxide, hafnium oxide, etc., and in one embodiment the capacitor insulator is ferroelectric (e.g., one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element).

Example integrated circuitry of construction 10 may be considered as comprising a plurality of features 27 that are horizontally arrayed in a two-dimensional (2D) lattice 26, and perhaps which is best viewed by referring to FIGS. 3-6. In one embodiment, the 2D lattice is a Bravais lattice (i.e., no gaps or overlaps within the lattice). Individual features 27 in one embodiment are circuit-operative in the integrated circuitry (i.e., in a finished construction) and in one embodiment as shown may be considered as individually comprising one of capacitor electrodes 24 of one of capacitors 14. Any alternate existing or future-developed circuit-operative feature (e.g., an electronic component or a portion thereof) may be used, for example conductive vias, resistors, transistor gates, etc., and such features need not be vertically elongated. Alternately, the individual features may be circuit-inoperative in the integrated circuitry, for example comprising insulative material, a void space, etc.

Figure 3:
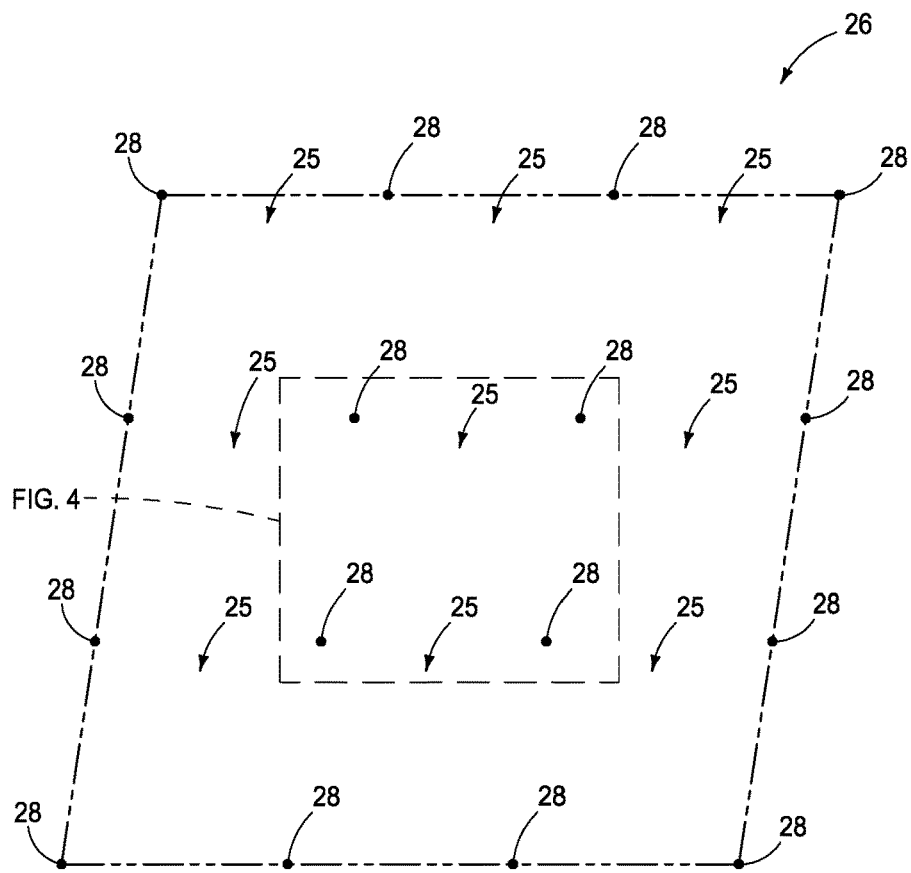
FIG. 3 is a diagrammatic plan view of a two-dimensional (2D) lattice in which the capacitors are arrayed in FIGS. 1 and 2.
Figure 4:
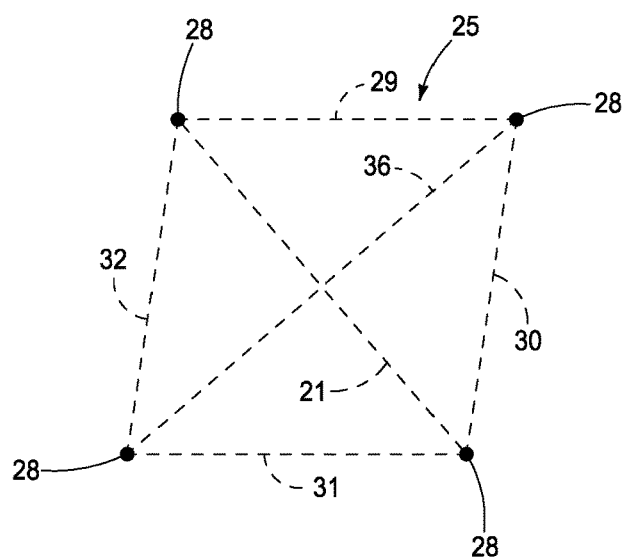
FIG. 4 is an enlarged view of a portion of FIG. 3.
Figure 5:
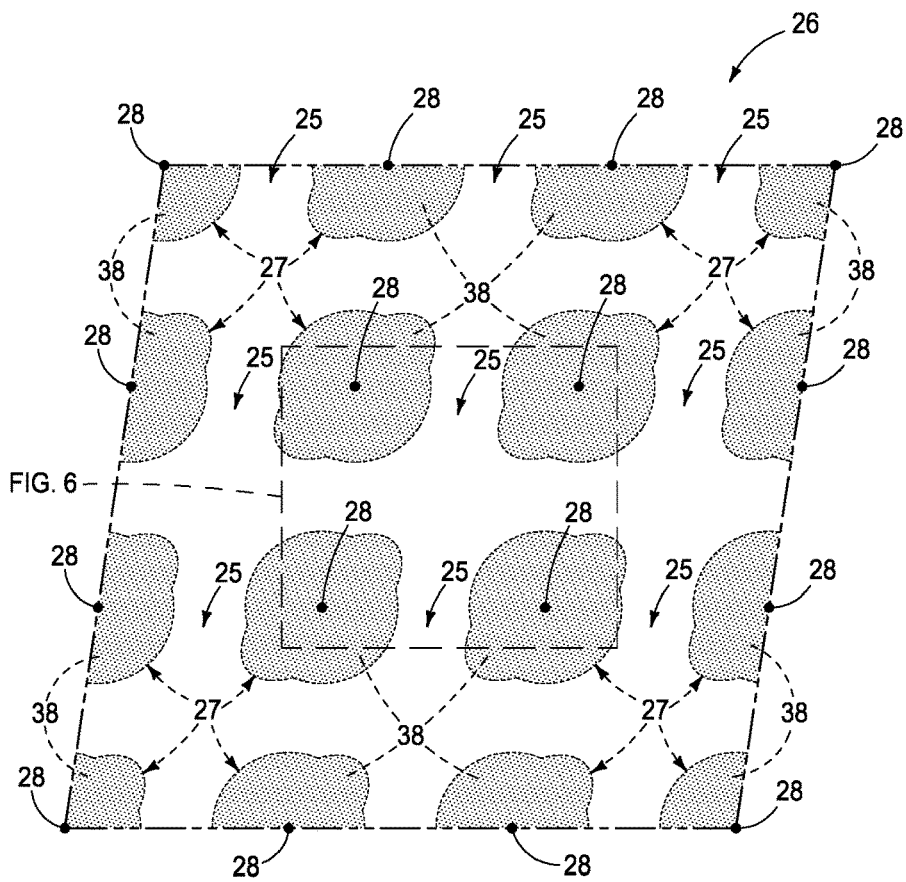
FIG. 5 is the same as FIG. 3 and with the addition of horizontal areas of certain portions of the capacitors of FIG. 1.
Figure 6:
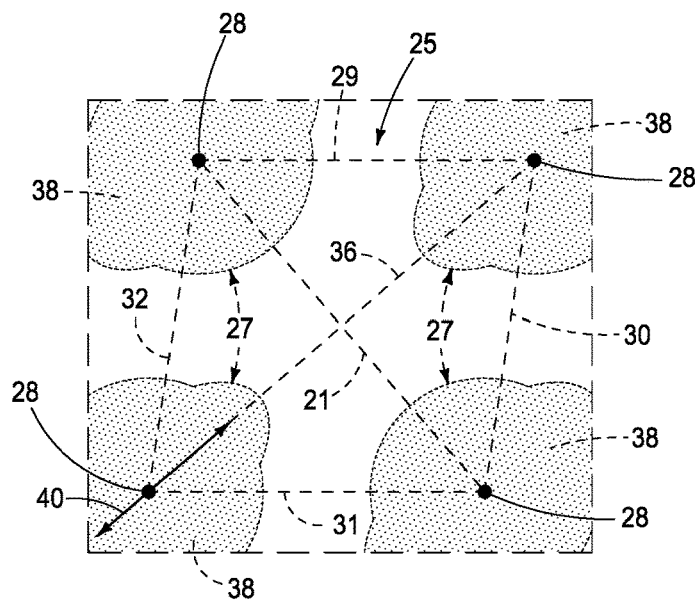
FIG. 6 is an enlarged view of a portion of FIG. 5.

Example 2D lattice 26 comprises a parallelogram unit cell 25 (FIGS. 3-6) having four lattice points 28 and having four straight-line sides 29, 30, 31, and 32 between pairs of four lattice points 28 (e.g., a simple polygon enclosing an interior region). In one embodiment and as shown, parallelogram unit cell 25 has only four lattice points 28. FIGS. 3 and 4 show parallelogram unit cell 25 in the absence of areas 38 (referred to below) whereas FIGS. 5 and 6 show areas 38 superimposed over parallelogram unit cells 25. Parallelogram unit cell 25 has a straight-line diagonal 36 there-across between two diagonally-opposed of four lattice points 28. Straight-line diagonal 36 is longer than each of four straight-line sides 29, 30, 31, and 32 (i.e., considered individually). Example parallelogram unit cell 25 has another such straight-line diagonal 21. Individual features 27, and correspondingly individual lower capacitor electrodes 24 in the example embodiment, are at one of the four lattice points 28 and occupy a maximum horizontal area 38 (e.g., all of the interior region of a simple polygon) that is horizontally elongated (i.e., has a maximum length that is greater than a maximum width) along a direction 40 that is horizontally angled relative to each of four straight-line sides 29, 30, 31, and 32. In the context of this document, "angle" and "angled" do not include the straight angle.

FIGS. 1-6 show an embodiment wherein parallelogram unit cell 25 has two straight-line diagonals 36, 21 that are not of the same length, and with direction 40 being along the longer of two straight-line diagonals 36 and 21. Alternately, direction 40 may be along the shorter of two straight-line diagonals 36 and 21 (not shown).

Figure 7:
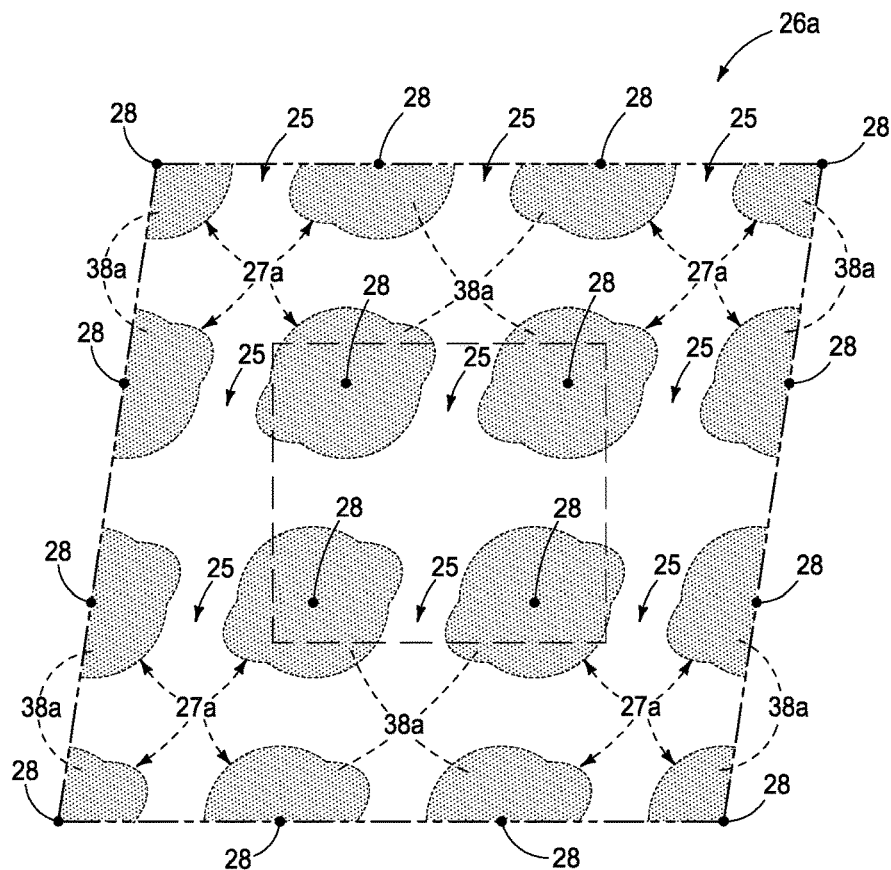
FIG. 7 is a diagrammatic plan view of the two-dimensional 2D lattice corresponding to FIG. 5, but wherein the horizontal areas of FIG. 5 are positioned differently.
Figure 8:
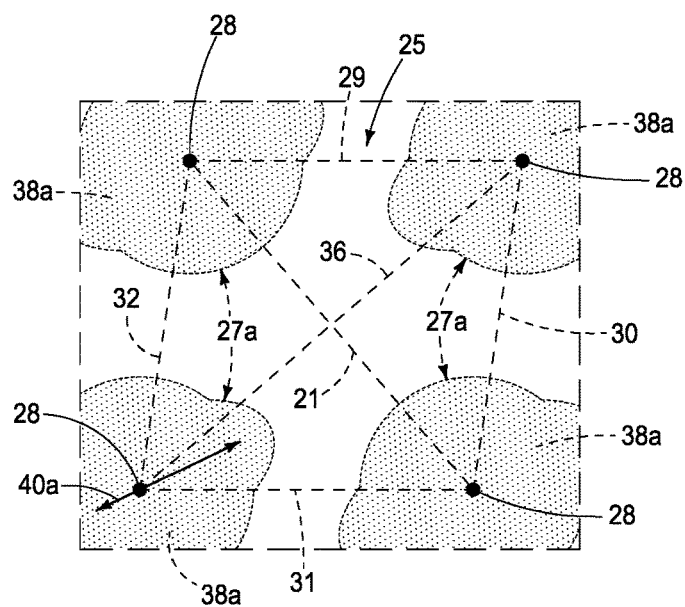
FIG. 8 is an enlarged view of a portion of FIG. 7.

In one embodiment and as shown, direction 40 is one of parallel to (not shown) or along (as shown) straight-line diagonal 36. An alternate embodiment construction lattice 260*a* lattice 26*a* is shown in FIGS. 7 and 8. Like numerals from the above-described embodiments have been used where appropriate, with some construction differences being indicated with the suffix "a". Features 27*a* have maximum horizontal areas 38*a* that are horizontally elongated along a direction 40*a* that is neither parallel to nor along any straight-line diagonal (e.g., 21, 36). In other words, direction 40*a* is angled from both of: a) each of four straight-line sides 29, 30, 31, 32, and b) all straight-line diagonals of parallelogram unit cell 25. Regardless, and in some embodiments as shown, individual maximum horizontal areas 38/38*a* are centered over their respective one lattice point 28. Any other attribute(s) or aspect(s) as shown and/or described herein with respect to other embodiments may be used.

Figure 9:
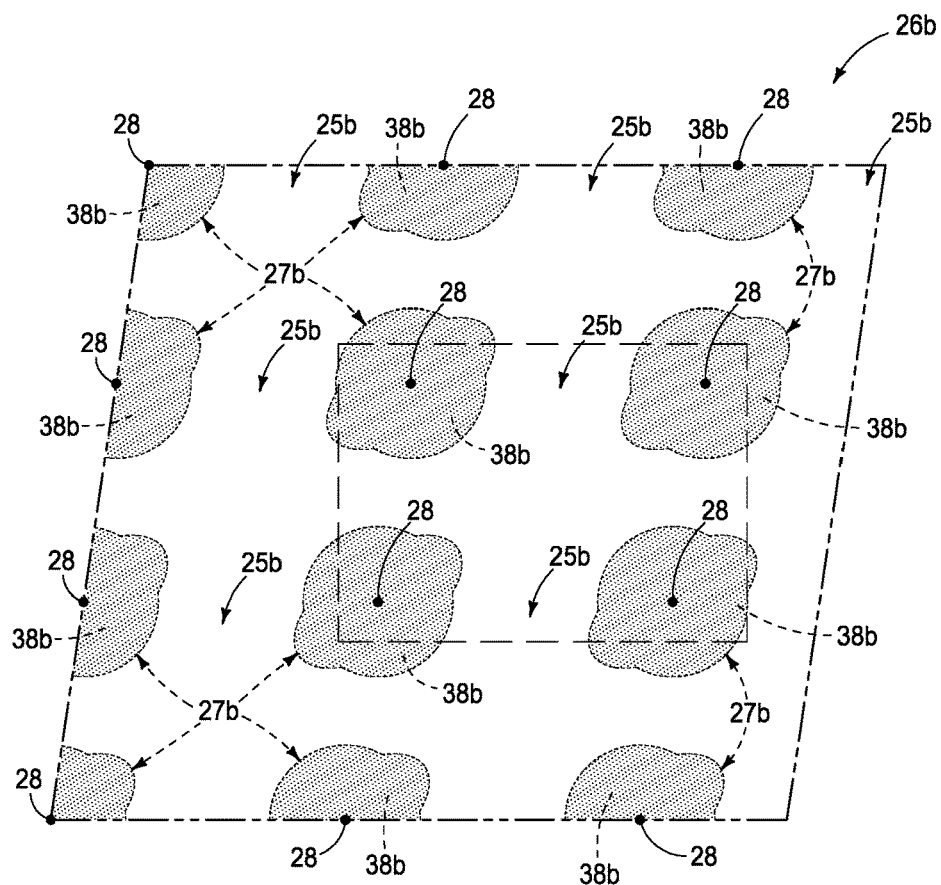
FIG. 9 is a diagrammatic plan view of an alternate 2D lattice to that of FIG. 5.
Figure 10:
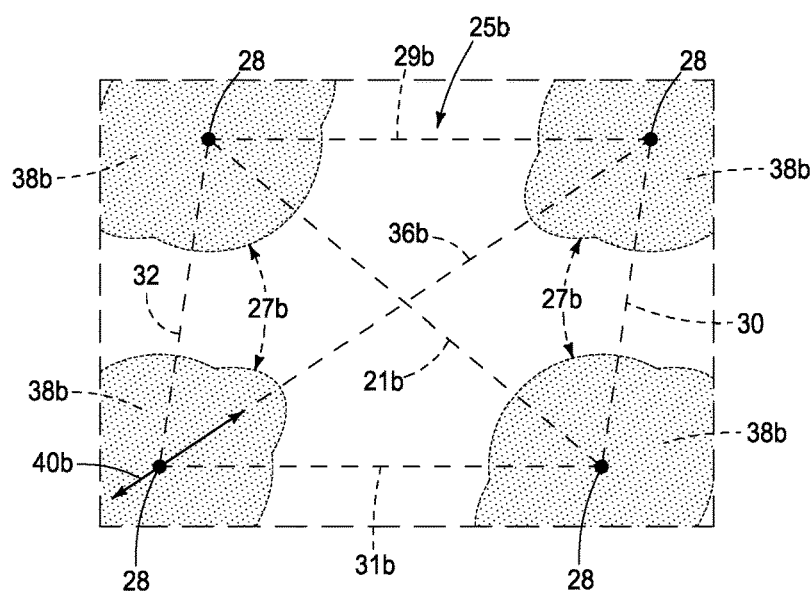
FIG. 10 is an enlarged view of a portion of FIG. 9.

FIGS. 3-8 show embodiments wherein none of four straight-line sides 29, 30, 31 or 42 intersects another one of such four straight-line sides at 90° in 2D lattice 26. FIGS. 9 and 10 illustrate another such example 2D lattice 26*b*, but in this example that is oblique (e.g., having a parallelogram unit cell 25b where no straight-line sides intersect at 90°, length of side 32 equals length of side 30, length of side 29b equals length of side 31b, and length of 31b/29b not being equal to length of 30/32). Like numerals from the above-described embodiments have been used where appropriate, with some construction differences being indicated with the suffix "b". Lengths of straight-line diagonals 36b and 21b are different from those of 36 and 21, respectively. Example maximum horizontal areas 38b of features 27b are elongate along a direction 40b. Any other attribute(s) or aspect(s) as shown and/or described herein with respect to other embodiments may be used.

Figure 11:
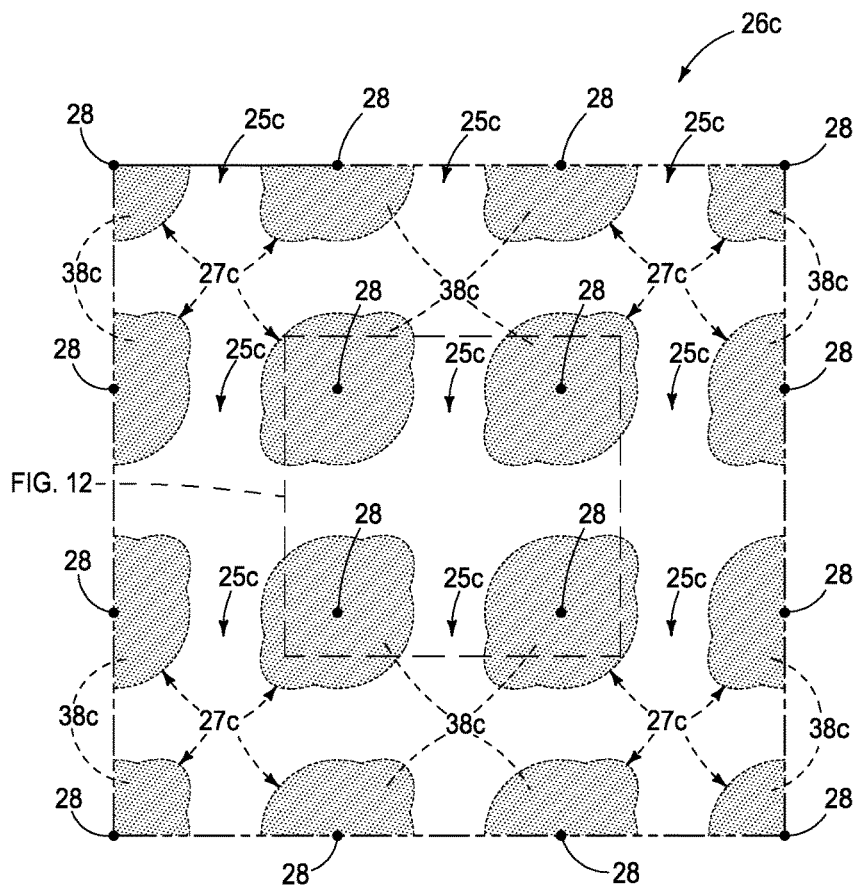
FIG. 11 is a diagrammatic plan view of an alternate 2D lattice to that of FIG. 5.
Figure 12:
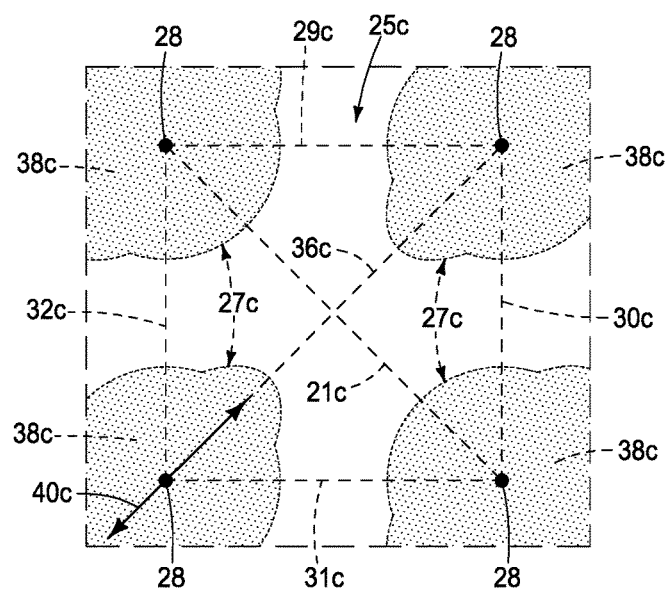
FIG. 12 is an enlarged view of a portion of FIG. 11.
Figure 13:
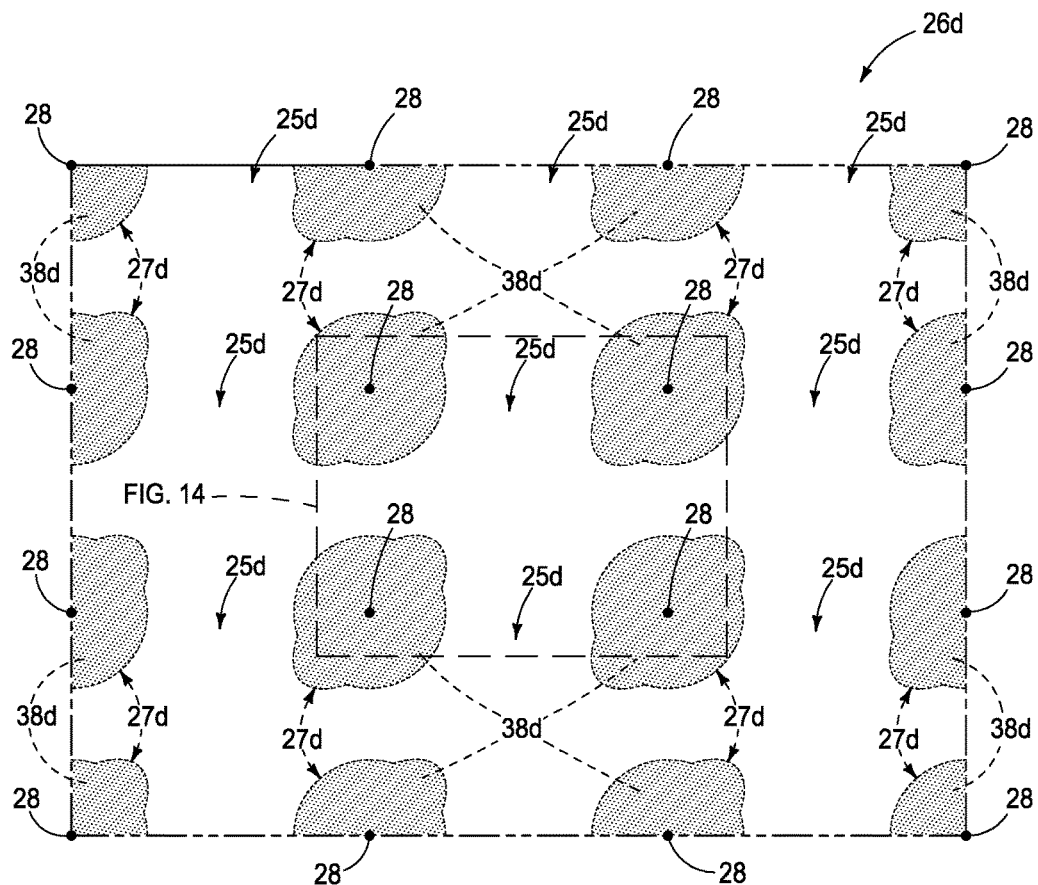
FIG. 13 is a diagrammatic plan view of an alternate 2D lattice to that of FIG. 5.
Figure 14:
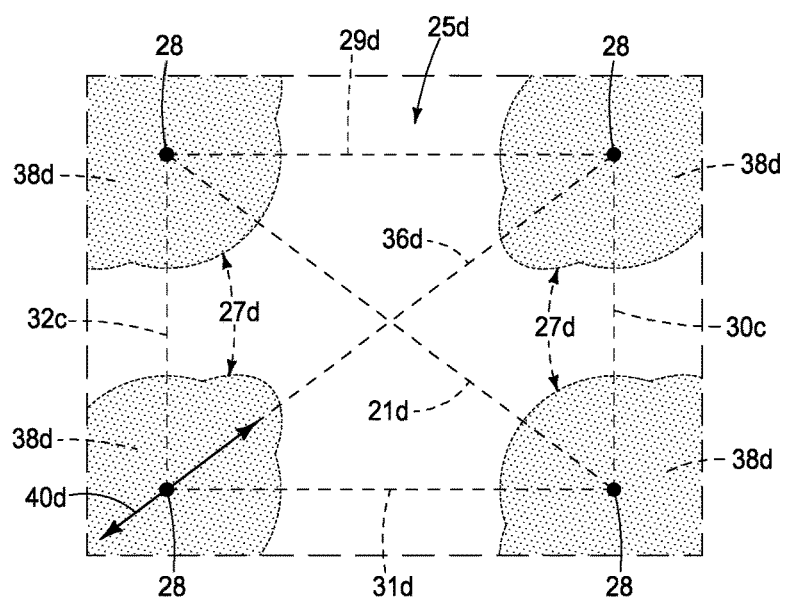
FIG. 14 is an enlarged view of a portion of FIG. 13.

FIGS. 11 and 12 show an alternate embodiment 2D lattice 26c that is square, and FIGS. 13 and 14 show an example embodiment 2D lattice 26d that is rectangular. Like numerals from the above-described embodiments have been used where appropriate, with some construction differences being indicated with the suffix "c" or the suffix "d". Parallelogram unit cell 25c in 2D lattice 26c has its two straight-line diagonals 36c, 21c of the same length relative one another and has four straight-line sides 29c, 30c, 31c, and 32c. Example maximum horizontal areas 38c of features 27c are elongate along a direction 40c. Lengths of straight-line diagonals 36d and 21d in parallelogram unit cell 25d of 2D lattice 26d are of different lengths relative one another. Example parallelogram unit cell 25d has four straight-line sides 29d, 30c, 31d, and 32c. Example maximum horizontal areas 38d of features 27d are elongate along a direction 40d. Any other attribute(s) or aspect(s) as shown and/or described herein with respect to other embodiments may be used.

Figure 15:
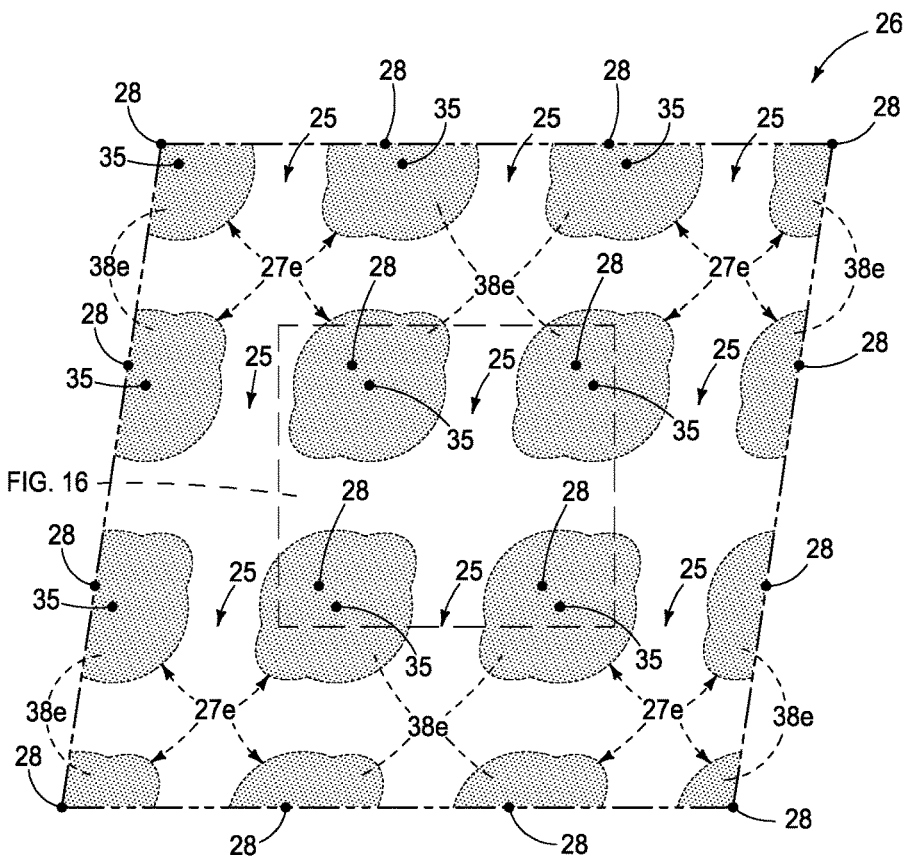
FIG. 15 is a diagrammatic plan view of the two-dimensional 2D lattice corresponding to FIG. 5, but wherein the horizontal areas of FIG. 5 are positioned differently.
Figure 16:
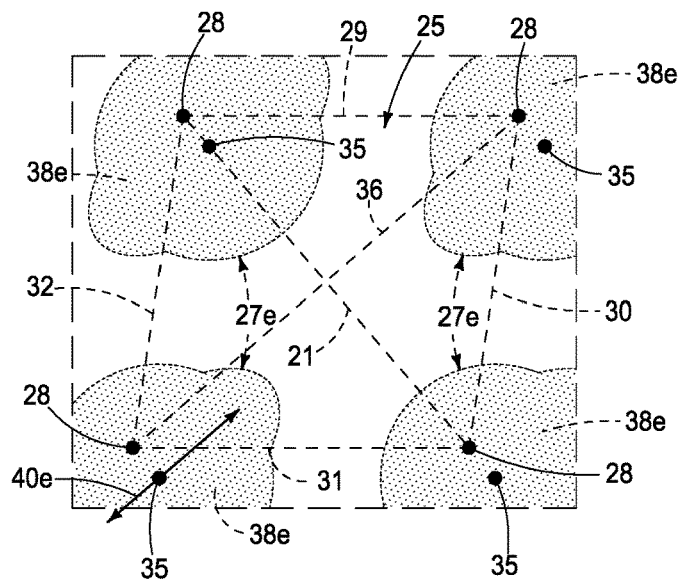
FIG. 16 is an enlarged view of a portion of FIG. 15.

In some embodiments, the maximum horizontal areas are individually not centered over their respective one lattice point. FIGS. 15 and 16 show one such embodiment wherein individual maximum horizontal areas 38e have a center 35 that is offset from its respective one lattice point 28 orthogonal to straight-line diagonal 36. Like numerals from the above-described embodiments have been used where appropriate, with some construction differences being indicated with the suffix "e" or with different numerals. In one such embodiment and as shown, direction 40e is parallel to straight-line diagonal 36, and in one embodiment as shown maximum horizontal areas 38e are individually longitudinally centered over (hut laterally aside) their respective one lattice point 28. Any other attribute(s) or aspect(s) as shown and/or described herein with respect to other embodiments may be used.

Figure 17:
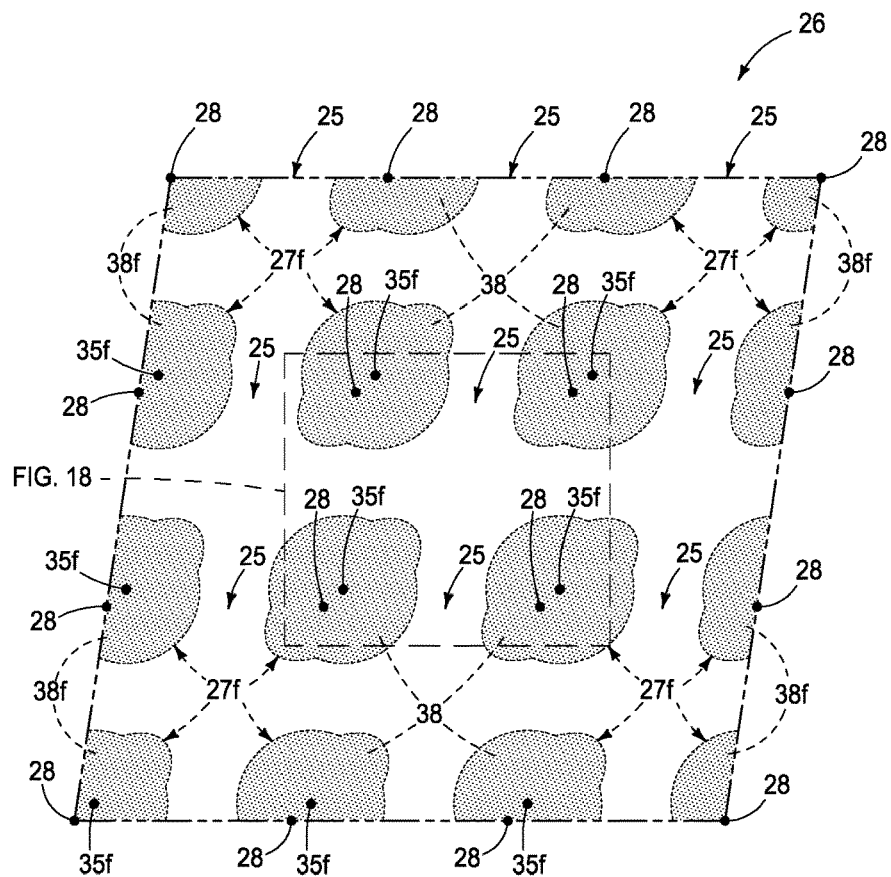
FIG. 17 is a diagrammatic plan view of the two-dimensional 2D lattice corresponding to FIG. 5, but wherein the horizontal areas of FIG. 5 are positioned differently.
Figure 18:
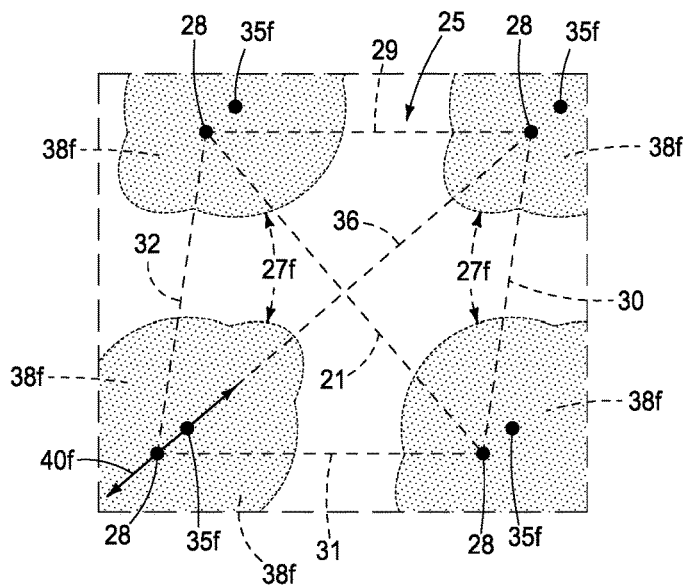
FIG. 18 is an enlarged view of a portion of FIG. 17.

FIGS. 17 and 18 show an alternate embodiment wherein individual maximum horizontal areas 38f have a center 35f that is offset from their respective one lattice point 28 along direction 40, which in one embodiment and as shown with direction 40f being along straight-line diagonal 36. Further, example maximum horizontal areas 38f are shown as individually being laterally centered over (but longitudinally displaced from) their respective one lattice point 28. Like numerals from the above-described embodiments have been used where appropriate, with some construction differences being indicated with the suffix "f". Any other attribute(s) or aspect(s) as shown and/or described herein with respect to other embodiments may be used.

Embodiments of the invention encompass a method used in the fabrication of integrated circuitry. Example such method embodiments are described with reference to FIGS. 19-37.

Figure 19:
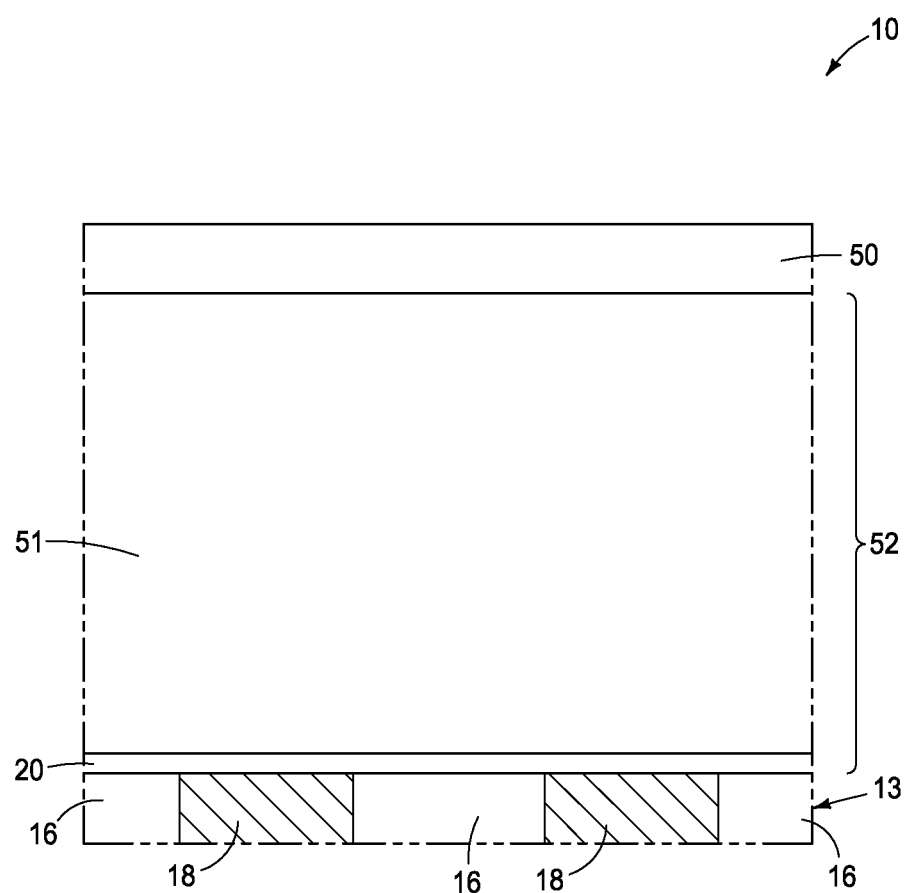
FIG. 19 is a diagrammatic cross-sectional view of a portion of a substrate construction in process in accordance with an embodiment of the invention.

Referring to FIG. 19, such shows an example predecessor construction 10 to any of the constructions/lattices/etc. described above. Like numerals have been used where appropriate for predecessor constructions. A masking material 50 has been formed over a target material 52 over base substrate 13. Some or all of such material may be sacrificial. By way of example only, example masking material includes an antireflective coating material (e.g., silicon oxynitride such as DARC) over a hard-mask material (e.g., amorphous carbon). Example target material 52 includes insulative material 51 and 20, for example one or more of silicon nitride and doped or undoped silicon dioxide. The discussion proceeds, by way of example only, in fabrication of the array of capacitors as shown in FIGS. 1-6, although any other attribute(s) or aspect(s) as shown and/or described herein with respect to other embodiments may additionally or alternately be used.

Figure 20:
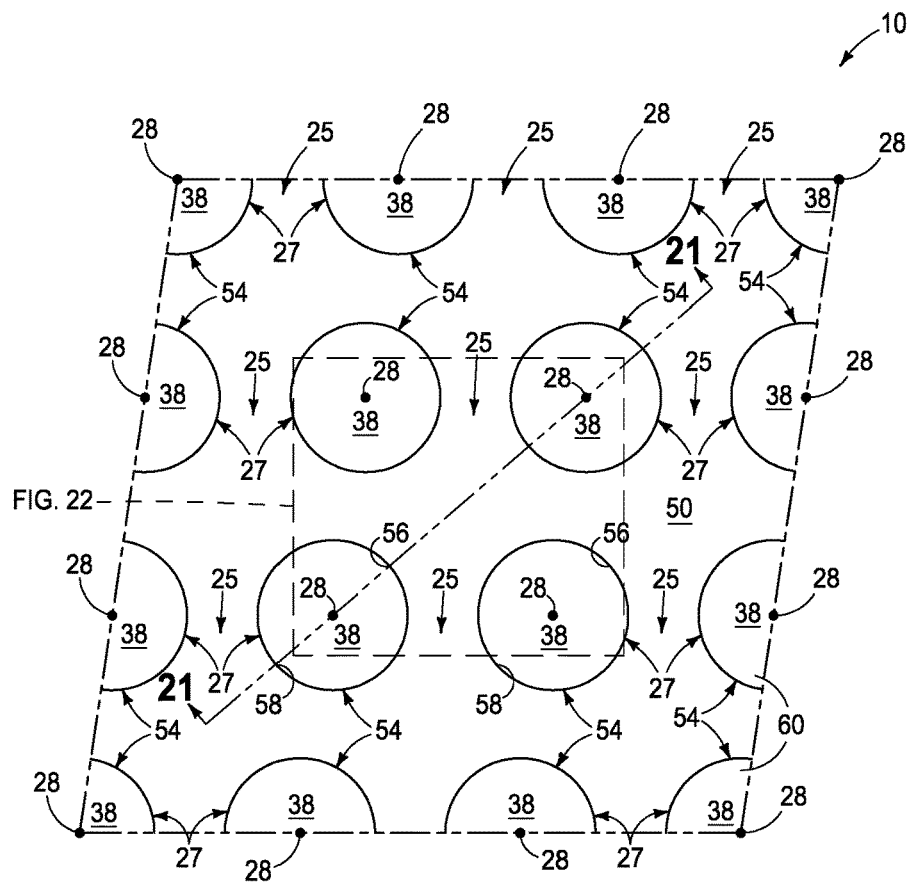
FIGS. 20-37 are diagrammatic sequential sectional and/or enlarged views of the construction of FIG. 1 in process in accordance with some embodiments of the invention.
Figure 21:
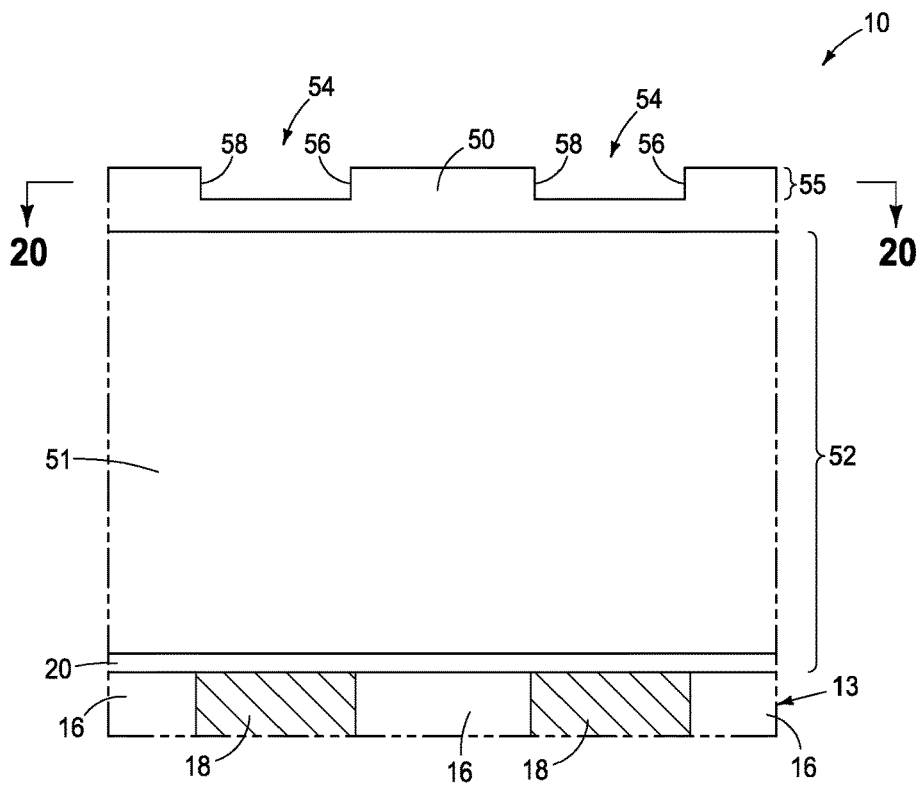
Figure 22:
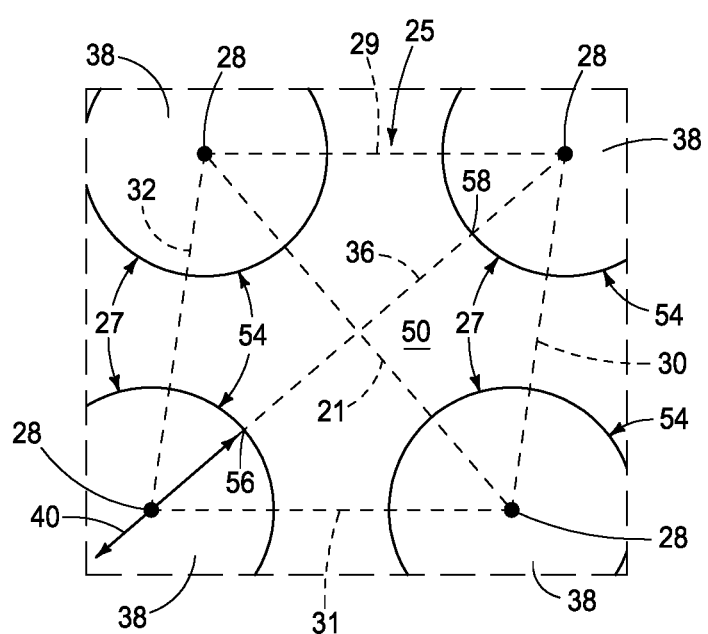

Referring to FIGS. 20-22, a plurality of mask openings 54 (that may be considered as features 27) has been formed into at least an outermost portion 55 of masking material 50, with example mask openings 54 extending only partially into masking material 50 at least at this point in the process. In an embodiment wherein masking material 50 comprises DARC over carbon, mask openings 54 may be formed using a mask (e.g., photoresist and not shown) having openings therein corresponding to position of mask openings 54 and etching mask openings 54 through the DARC to stop on the carbon. Regardless, example mask openings 54 are horizontally arrayed in 2D lattice 26 that comprises parallelogram unit cell 25 having four lattice points 28 and having four straight-line sides 29, 30, 31, and 32 (FIG. 22) between pairs of the four lattice points. Parallelogram unit cell 25 has a straight-line diagonal 36 and/or 21 there-across between two diagonally-opposed of the four lattice points and that is longer than each of the four straight-line sides. Individual mask openings 54 are at one of the four lattice points and individually occupy an outermost maximum horizontal area 38. For purposes of the continuing discussion, mask openings 54 may be considered as comprising one sidewall 56 and another sidewall 58 that laterally opposes one sidewall 56. Alternately, sidewall 58 may be considered as the one sidewall and sidewall 56 may be considered as the another sidewall.

Figure 23:
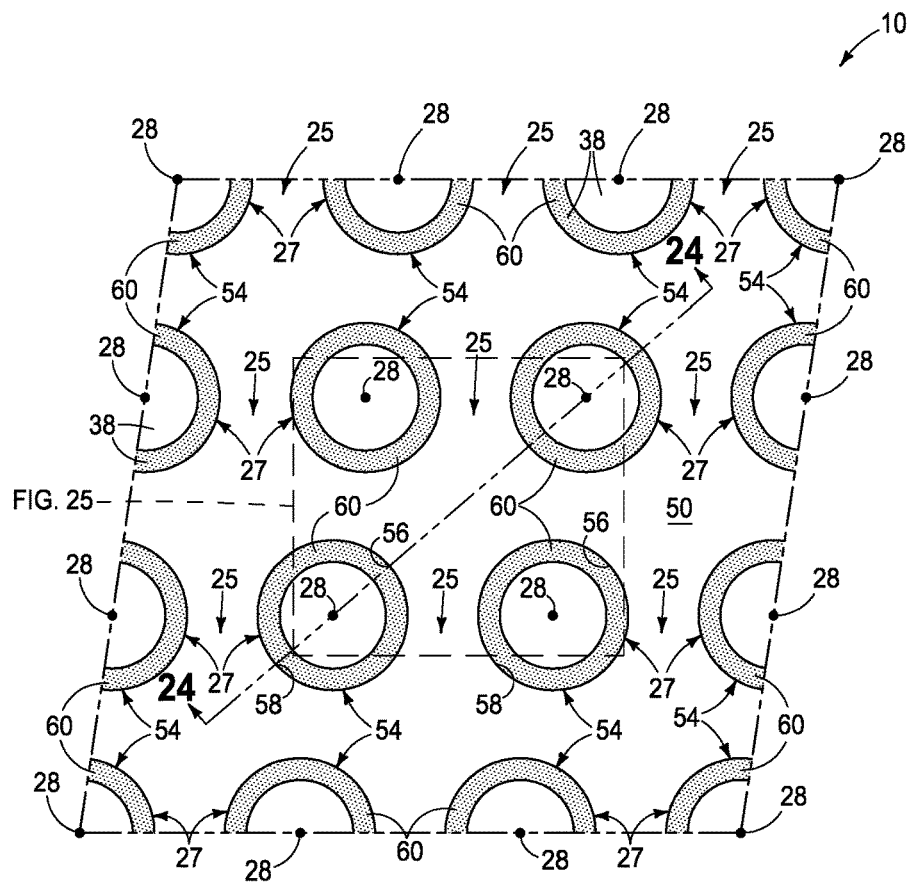
Figure 24:
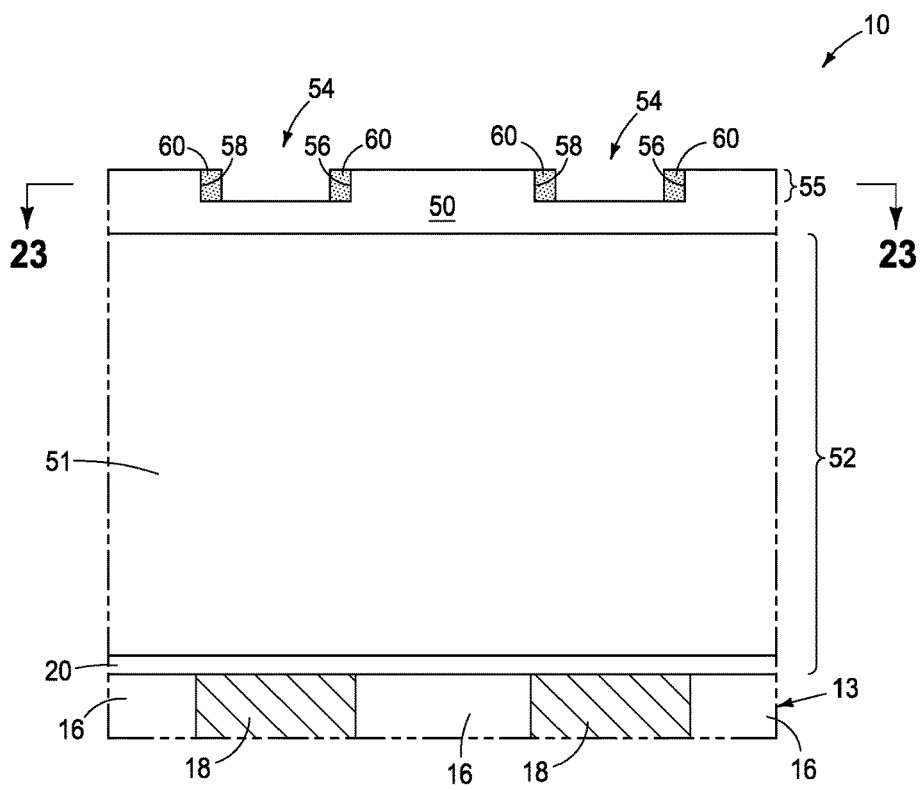
Figure 25:
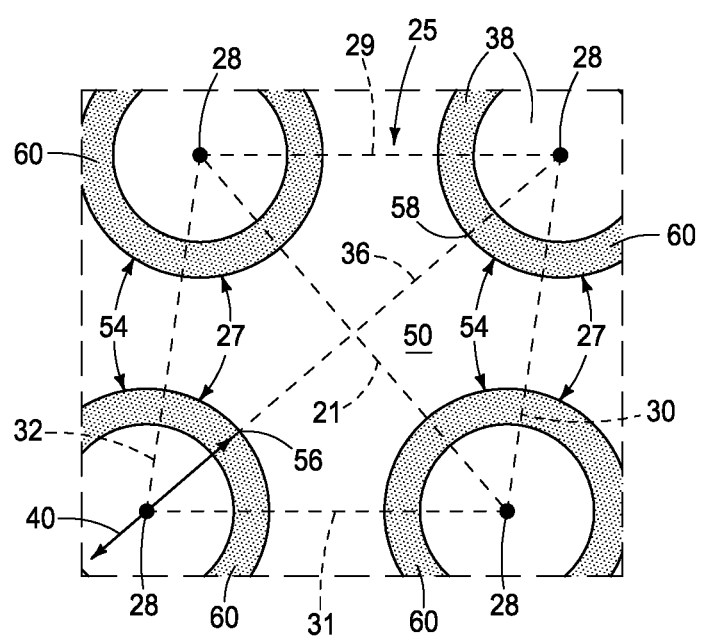

Referring to FIGS. 23-25, and in one embodiment, all sidewalls of individual mask openings 54 have been lined with a mask material 60. An example technique for forming mask material 60 as shown is deposition of a conformal layer thereof, followed by anisotropic etching of such layer to substantially remove it from being over horizontal surfaces as shown. Mask material 60 and outermost portion 55 of masking material 50 may be of different compositions relative one another or may be of the same composition relative one another. In one embodiment, mask material 60 as a lateral thickness of at least 25 Angstroms.

Some of masking material 50 is removed from at least one sidewall 56 and/or 58 of individual mask openings 54 to horizontally elongate such mask openings along a direction that is horizontally angled relative to each of four straight-line sides 29, 30, 31, and 32 of parallelogram unit cell 25. Ideally, such act of removing comprises one or both of ion beam etching and angled chemical etching. Further ideally, such act of removing some of masking material 50 is from both sidewalls 56 and 58, with in one embodiment such act of removing occurring at different times and in another embodiment occurring simultaneously.

Figure 26:
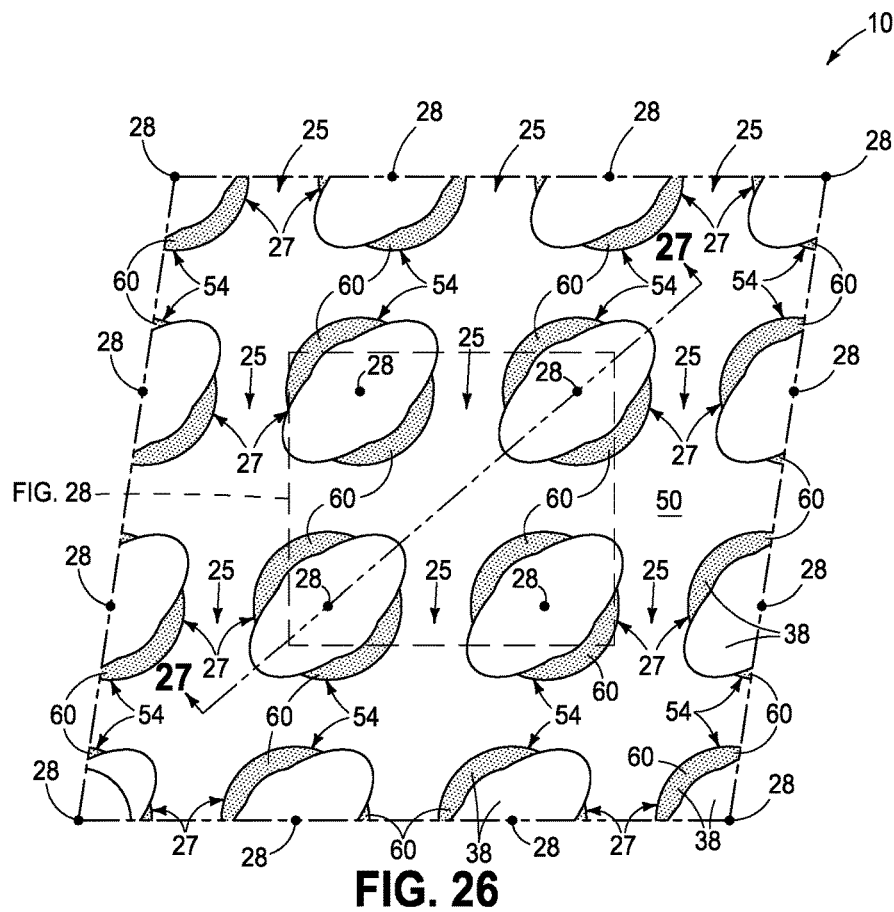
Figure 27:
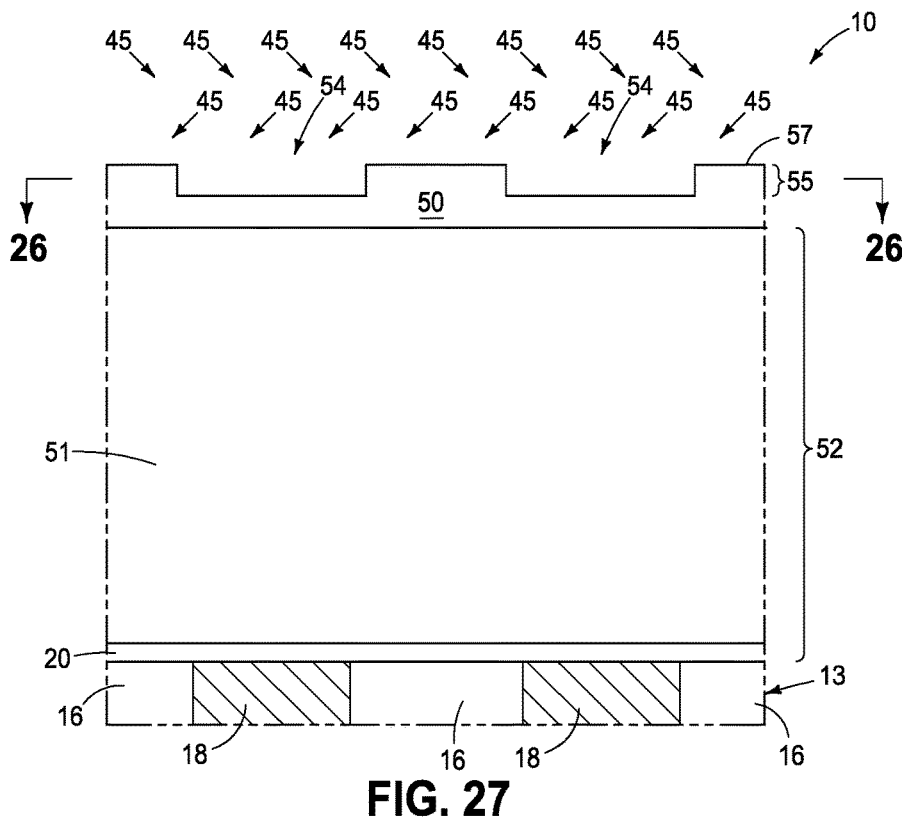
Figure 28:
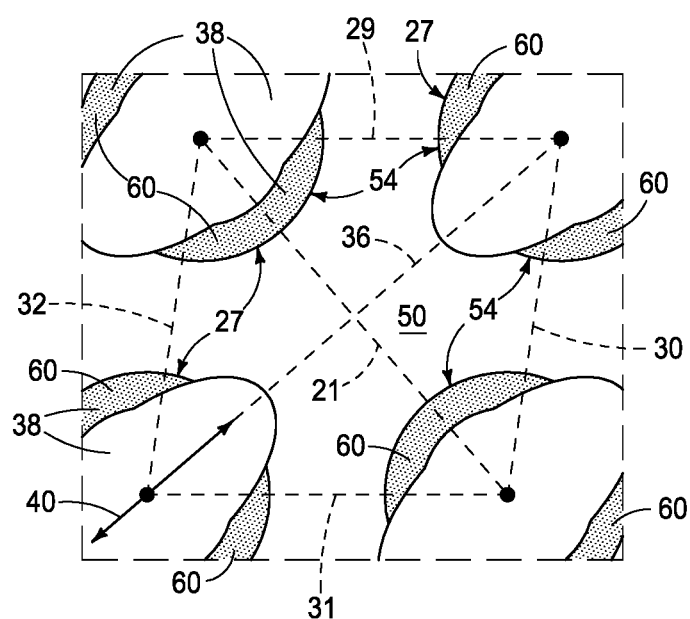

Referring to FIGS. 26-28, mask material 60 has been removed from being over at least one sidewall 56, 58 (both sidewalls 56, 58 as shown) of individual mask openings 54. By way of example, such may occur by the above-described ion beam etching and/or angled chemical etching. This has been followed by removing some of masking material 50 from at least one sidewall 56, 58 (from both as shown, with sidewalls 56 and 58 not being viewable in any of FIGS. 26-28) of individual mask openings 54 to horizontally elongate individual mask openings 54 along direction 40 that is horizontally angled relative to each of four straight-lines sides 29, 30, 31, and 32 of parallelogram unit cell 25, again by way of example using the above-described ion beam etching and angled chemical etching. Example ion beam etching comprises directing an ion beam (exemplified by arrows 45) at least one sidewall 56, 58 at an angle from vertical relative to a mean global outermost surface 57 (e.g., regardless of whether planar) of masking material 50. Alternately or additionally, an example act of such removing comprises angled chemical etching directed at the at least one sidewall at an angle from vertical relative to a mean global outermost surface 57 of masking material 50. Regardless, any suitable angle from vertical may be used, with most likely smaller angles from vertical being used for high or higher aspect ratio mask openings 54 and greater angles from vertical being usable for small or smaller aspect ratio mask openings 54.

Accordingly, and in one embodiment, the act of removing of some masking material 50 from at least one of sidewalls 56 and 58 may at least predominately (i.e., up to and including 100%) comprise chemical etching (e.g., angled chemical etching) conducted selectively relative to remaining of mask material 60 that is within individual mask openings 54. In another embodiment, the act of removing some of masking material 50 from at least one sidewall 56 and 58 may at least predominately (i.e., up to and including 100%) be by a non-chemical physical removal (e.g., ion beam etching) of masking material 50 from the at least one sidewall. Ion beam etching may require removal from two laterally opposing sidewalls at different time whereas angled chemical etching may enable removal from two laterally opposing sidewalls simultaneously. FIGS. 26-28 show an example embodiment wherein mask material 60 has been removed from being over both of sidewalls 58 and 60 before removing masking material 50 from respective sidewalls 58 and 60.

Figure 35:
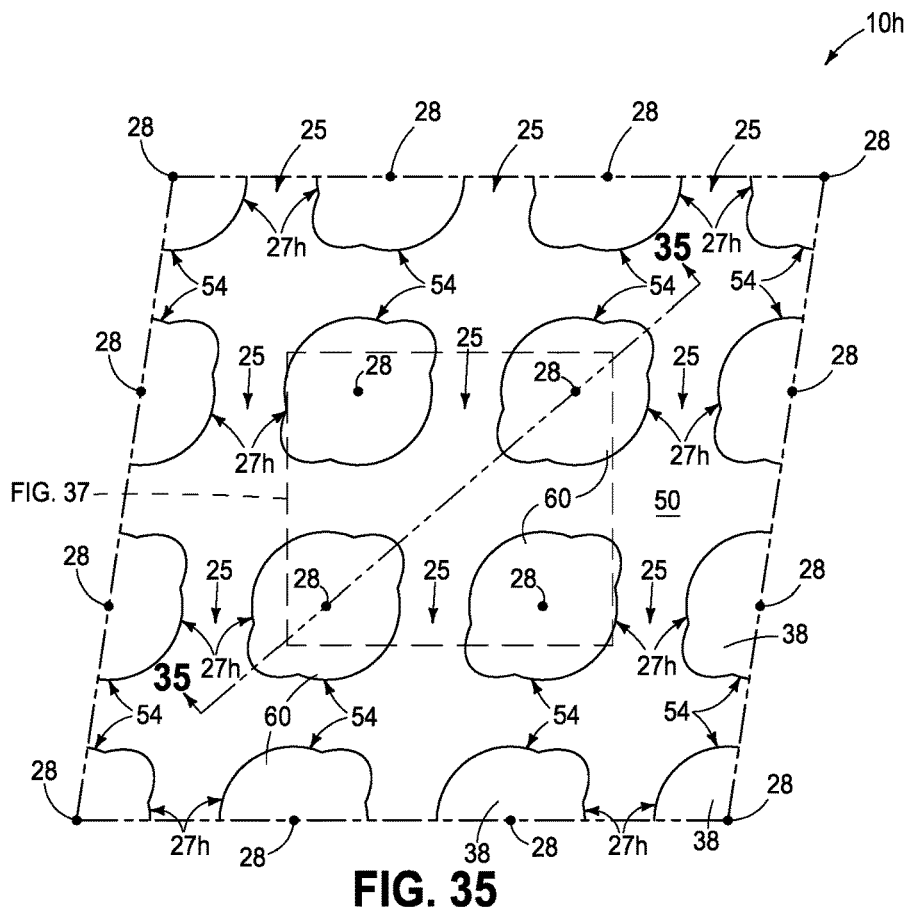
Figure 36:
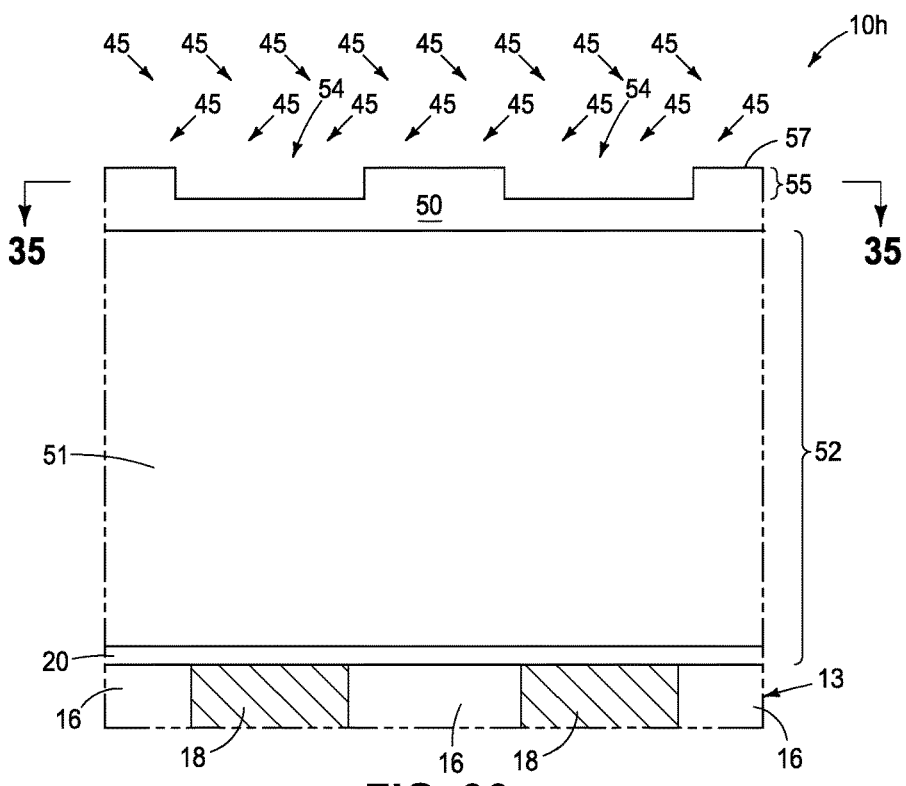
Figure 37:
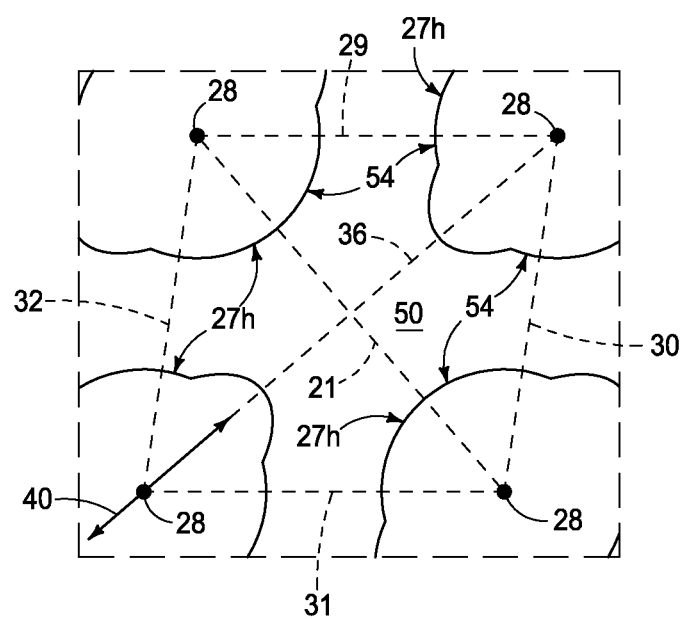

FIGS. 35-37 show an example alternate embodiment where masking material openings are elongated without using mask material 60 (not shown). Like numerals from the above-described embodiments have been used where appropriate, with some construction differences being indicated with the suffix "h". FIGS. 35-37 show processing having occurred relative to the construction of FIGS. 20-22 (that has no mask material 60) for example by directing an ion beam 45 at least one sidewall 56 or 58 (both as shown) at an angle from vertical relative to mean global outermost surface 57 of masking material 50. Any other attribute(s) or aspect(s) as shown and/or described herein with respect to other embodiments may be used.

Figure 29:
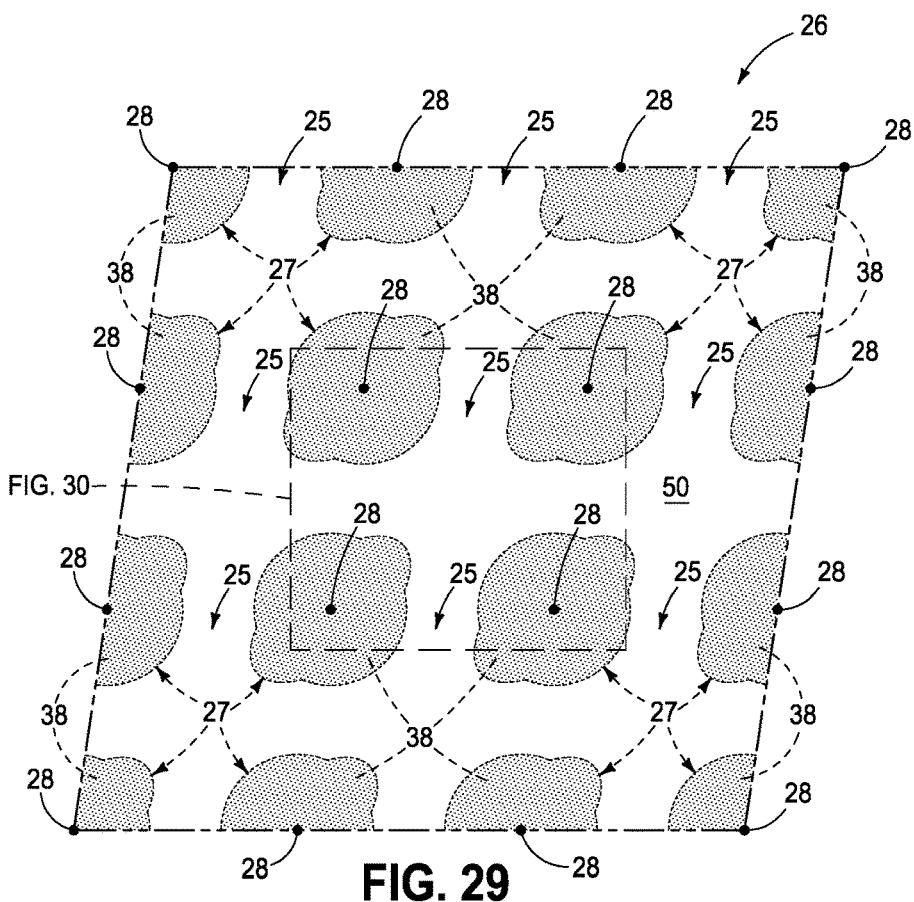
Figure 30:
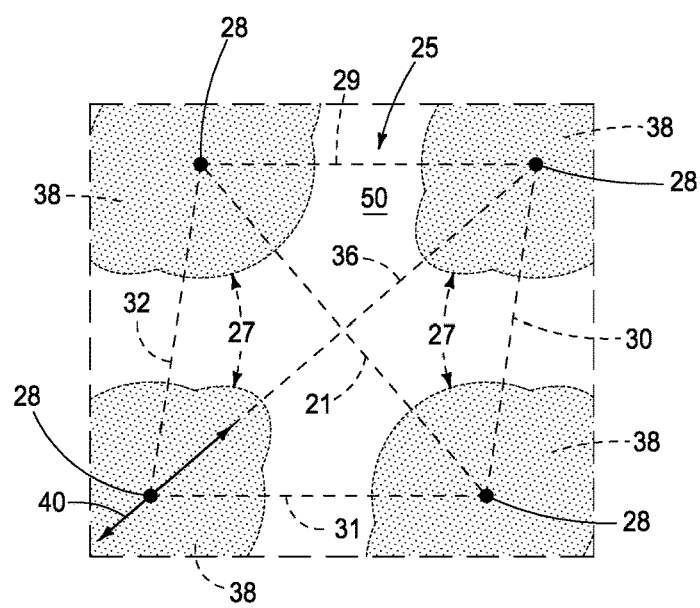
Figure 31:
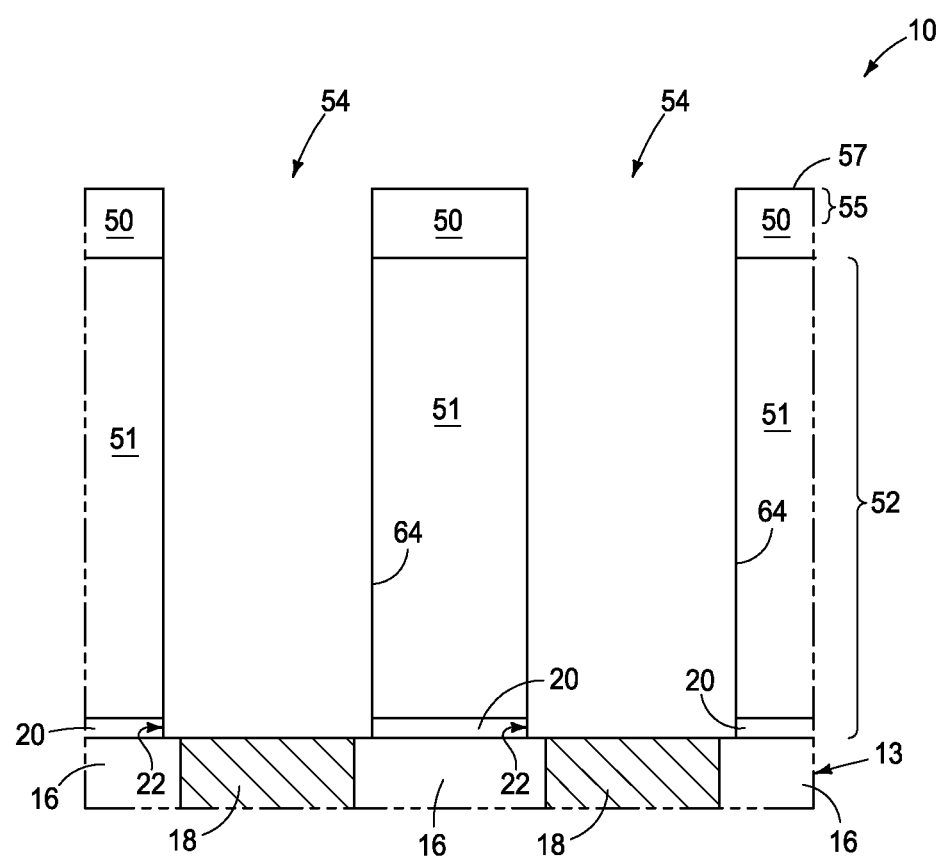

Regardless, after the removing of some of masking material 50 from at least one sidewall 56 and/or 58 of individual mask openings 54 to horizontally elongate such mask openings, masking material 50 is used as an etch mask while etching target openings into target material 52 through horizontally-elongated mask openings 54 in masking material 50. FIGS. 29 and 30 show an example embodiment wherein all remaining of mask material 60 (not shown) has been removed (e.g., by etching) from mask openings 54, and which has been followed by etching target openings 64 into target material 52 as shown in FIG. 31.

Figure 32:
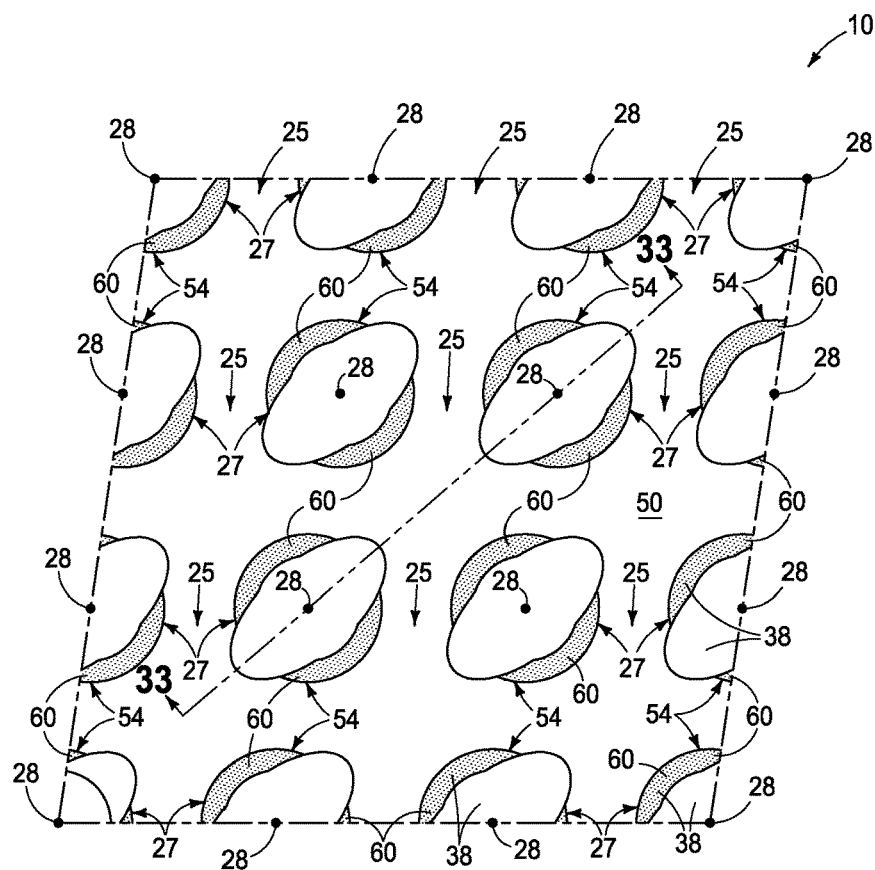
Figure 33:
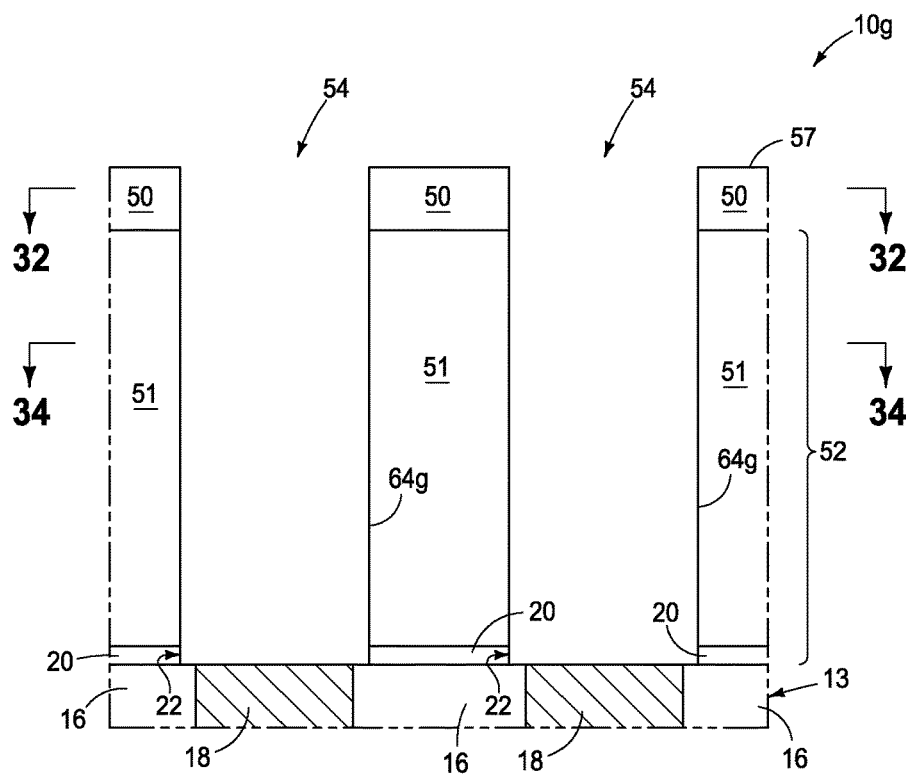
Figure 34:
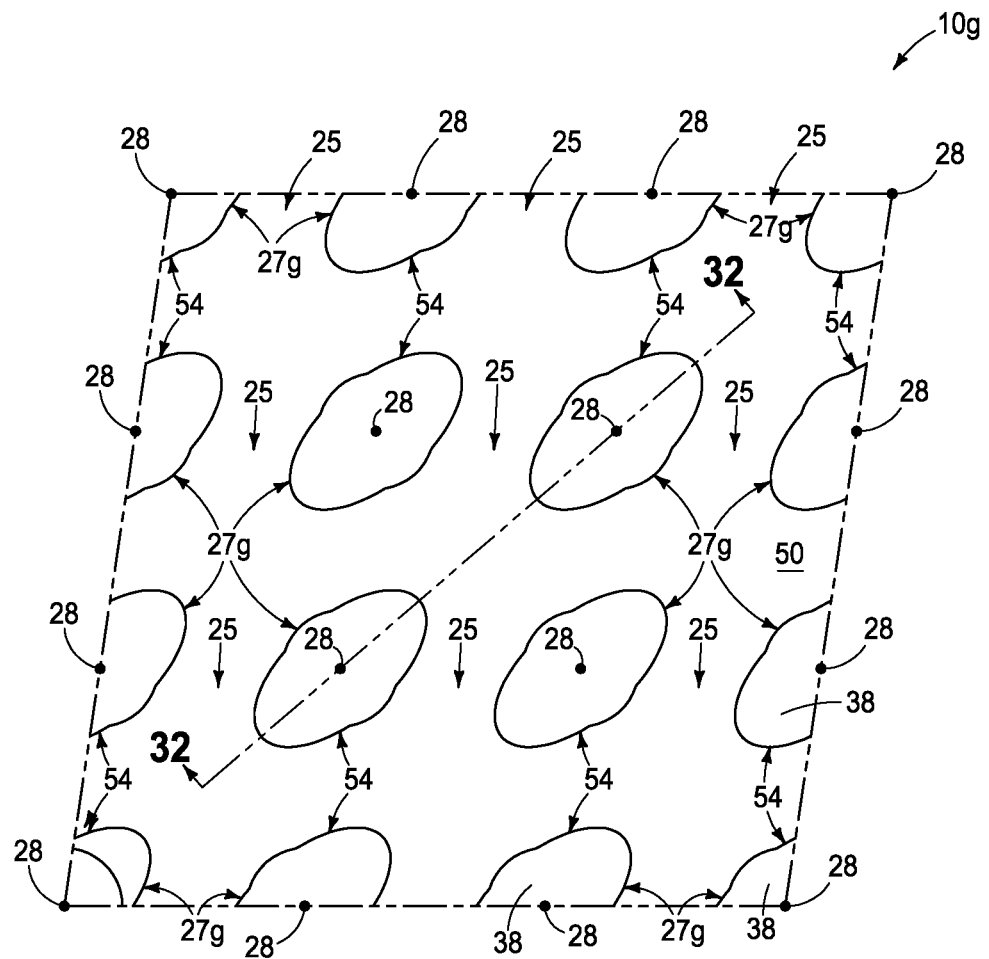

FIGS. 32-34 show an alternate embodiment construction 10g. Like numerals from the above-described embodiments have been used where appropriate, with some construction differences being indicated with the suffix "g". In FIGS. 32-34, target openings 64g have been etched into target material 52 while some of mask material 60 (all as shown remaining in FIGS. 26, 28, and 32) is over at least one of the sidewalls (other than sidewalls 56 and 58) of individual mask openings 54. Any other attribute(s) or aspect(s) as shown and/or described herein with respect to other embodiments may be used.

Processing may occur subsequently, for example to produce the construction of FIGS. 1-6. For example, masking material 50 could be removed followed by formation of lower capacitor electrodes 24 in target openings 64/64g, then removing of all target material 52, and then deposition of capacitor insulator 42 and material of upper capacitor electrode 44. Regardless, in one embodiment conductive material is formed within the target openings and in one embodiment the target openings are at least predominantly (i.e., up to and including 100%) by volume filled with insulative material.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated region s/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, integrated circuitry comprises a plurality of features horizontally arrayed in a two-dimensional (2D) lattice. The 2D lattice comprises a parallelogram unit cell having four lattice points and four straight-line sides between pairs of the four lattice points. The parallelogram unit cell has a straight-line diagonal there-across between two diagonally-opposed of the four lattice points. The straight-line diagonal is longer than each of the four straight-line sides. Individual of the features are at one of the four lattice points and occupy a maximum horizontal area that is horizontally elongated along a direction that is horizontally angled relative to each of the four straight-line sides.

In some embodiments, an array of capacitors of integrated circuitry comprises lower capacitor electrodes horizontally arrayed in a two-dimensional (2D) lattice. The 2D lattice comprises a parallelogram unit cell having four lattice points and four straight-line sides between pairs of the four lattice points. The parallelogram unit cell has a straight-line diagonal there-across between two diagonally-opposed of the four lattice points. The straight-line diagonal is longer than each of the four straight-line sides. The lower capacitor electrodes individually are at one of the four lattice points and individually occupy a maximum horizontal area that is horizontally elongated along a direction that is horizontally angled relative to each of the four straight-line sides. A capacitor insulator is atop the lower capacitor electrodes and at least one upper capacitor electrode is atop the capacitor insulator.

In some embodiments, a method used in the fabrication of integrated circuitry comprises forming masking material over a target material. A plurality of mask openings is formed into at least an outermost portion of the masking material. The mask openings are horizontally arrayed in a two-dimensional (2D) lattice. The 2D lattice comprises a parallelogram unit cell having four lattice points and four straight-line sides between pairs of the four lattice points. The parallelogram unit cell has a straight-line diagonal there-across between two diagonally-opposed of the four lattice points. The straight-line diagonal is longer than each of the four straight-line sides. Individual of the mask openings are at one of the four lattice points and individually occupy an outermost maximum horizontal area. Some of the masking material is removed from at least one sidewall of the individual mask openings to horizontally elongate the individual mask openings along a direction that is horizontally angled relative to each of the four straight-line sides of the parallelogram unit cell. After the removing, the masking material is used as an etch mask while etching target openings into the target material through the horizontally-elongated mask openings in the masking material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising:
a plurality of features horizontally arrayed in a two-dimensional (2D) lattice;
the 2D lattice comprising a parallelogram unit cell having four lattice points and having four straight-line sides between pairs of the four lattice points, the parallelogram unit cell having a straight-line diagonal there-across between two diagonally-opposed lattice points of the four lattice points, the straight-line diagonal being longer than each of the four straight-line sides; and
individual features comprised by the plurality of the features being at one of the lattice points comprised by the four lattice points and occupying a maximum horizontal area that is horizontally elongated along a direction that is horizontally angled relative to each of the four straight-line sides, each of the individual features comprised by the plurality of features having an outermost perimeter comprising a central circular area and opposing extension areas that extend along the direction.

2. The integrated circuitry of claim 1 wherein the direction is parallel to or along the straight-line diagonal.

3. The integrated circuitry of claim 1 wherein the direction is angled from both of: a) each of the four straight-line sides, and b) all straight-line diagonals of the parallelogram unit cell.

4. The integrated circuitry of claim 1 wherein the straight-line diagonal is a longer straight-line diagonal, the parallelogram unit cell comprising a shorter straight-line diagonal there-across between another two diagonally-opposed lattice points of the four lattice points.

5. The integrated circuitry of claim 1 wherein the maximum horizontal areas are individually laterally centered over their respective one lattice point of the four lattice points.

6. The integrated circuitry of claim 1 wherein the maximum horizontal areas are individually longitudinally centered over their respective one lattice point of the four lattice points.

7. The integrated circuitry of claim 1 wherein the maximum horizontal areas are individually centered over their respective one lattice point of the four lattice points.

8. The integrated circuitry of claim 1 wherein the maximum horizontal areas are individually not centered over their respective one lattice point of the four lattice points.

9. The integrated circuitry of claim 1 wherein the individual features comprised by the plurality of features are circuit-operative in the integrated circuitry.

10. The integrated circuitry of claim 9 wherein the individual features comprised by the plurality of features comprise a capacitor electrode of a capacitor.

11. The integrated circuitry of claim 1 wherein the individual features comprised by the plurality of features are circuit-inoperative in the integrated circuitry.

12. The integrated circuitry of claim 1 wherein the 2D lattice is a Bravais lattice.

13. A method used in the fabrication of integrated circuitry, comprising:
forming masking material over a target material;
forming a plurality of mask openings into at least an outermost portion of the masking material, the plurality of mask openings being horizontally arrayed in a two-dimensional (2D) lattice, the 2D lattice comprising a parallelogram unit cell having four lattice points and having four straight-line sides between pairs of the four lattice points, the parallelogram unit cell having a straight-line diagonal there-across between two diagonally-opposed lattice points of the four lattice points, the straight-line diagonal being longer than each of the four straight-line sides, individual at mask openings comprised by the plurality of mask openings being at one of the four lattice points and individually occupying an outermost maximum horizontal area;
removing some of the masking material from at least one sidewall of the individual mask openings comprised by the plurality of mask openings to horizontally elongate the individual mask openings along a direction that is horizontally angled relative to each of the four straight-line sides of the parallelogram unit cell; and
after the removing, using the masking material as an etch mask while etching target openings into the target material through the plurality of horizontally-elongated mask openings in the masking material.

14. The method of claim 13 wherein the mask openings comprised by the plurality of mask openings extend only partially into the masking material at least prior to the removing.

15. The method of claim 13 wherein the removing comprises directing an ion beam at the at least one sidewall at an angle from vertical relative to a mean global outermost surface of the masking material.

16. The method of claim 15 wherein the removing is at least predominantly by chemical etching of the masking material from the at least one sidewall.

17. The method of claim 15 wherein the removing is at least predominantly by non-chemical physical removal of the masking material from the at least one sidewall.

18. The method of claim 13 wherein the removing at least predominantly comprises angled chemical etching directed at the at least one sidewall at an angle from vertical relative to a mean global outermost surface of the masking material.

19. The method of claim 13 wherein the removing of some of the masking material is from the one sidewall of the individual mask openings comprised by the plurality of mask openings and is from another sidewall of the individual mask openings comprised by the plurality of mask openings that laterally opposes the one sidewall.

20. The method of claim 19 wherein the removing from the one sidewall and the another sidewall occur at different times.

21. The method of claim 19 wherein the removing from the one sidewall and the another sidewall occurs simultaneously.

22. The method of claim 13 comprising:
lining all sidewalls of the individual mask openings comprised by the plurality of mask openings with a mask material before the removing of some of the masking material from the at least one sidewall; and
removing the mask material from being over the at least one sidewall of the individual mask openings comprised by the plurality of mask openings before the removing of some of the masking material from the at least one sidewall.

23. The method of claim 22 wherein the mask material has a lateral thickness of at least 25 Angstroms.

24. The method of claim 22 wherein,
the removing of some of the masking material is from the one sidewall of the individual mask openings comprised by the plurality of mask openings and is from another sidewall of the individual mask openings comprised by the plurality of mask openings that laterally opposes the one sidewall; and
removing the mask material from being over the another sidewall of the individual mask openings comprised by the plurality of mask openings before the removing of some of the masking material from the another sidewall.

25. The method of claim 22 wherein the mask material and the outermost portion of the masking material are of different compositions relative one another.

26. The method of claim 25 wherein the removing of some of the masking material from the at least one sidewall of the individual mask openings comprised by the plurality of mask openings at least predominantly comprises chemical etching of the at least one sidewall and that is conducted selectively relative to remaining of the mask material that is within the individual mask openings comprised by the plurality of mask openings.

27. The method of claim 26 wherein the chemical etching comprises angled chemical etching directed at the at least one sidewall at an angle from vertical relative to a mean global outermost surface of the masking material.

28. The method of claim 22 wherein the mask material and the outermost portion of the masking material are of the same composition relative one another, the removing of some of the masking material from the at least one sidewall of the individual mask openings comprised by the plurality of mask openings at least predominantly being by non-chemical physical removal of the masking material from the at least one sidewall.

29. The method of claim 28 wherein the removing of some of the masking material from the at least one sidewall of the individual mask openings comprised by the plurality of mask openings comprises directing an ion beam at the at least one sidewall at an angle from vertical relative to a mean global outermost surface of the masking material.

30. The method of claim 22 comprising removing all remaining of the mask material from the mask openings comprised by the plurality of mask openings prior to etching the target openings into the target material.

31. The method of claim 22 comprising etching the target openings into the target material while some of the mask material is over at least one of the sidewalls of the individual mask openings comprised by the plurality of mask openings.

32. The method of claim 13 comprising forming conductive material within the target openings.

33. The method of claim 13 comprising at least predominantly by volume filling the target openings with insulative material.

* * * * *